United States Patent
Mackie et al.

(10) Patent No.: US 7,897,020 B2
(45) Date of Patent: Mar. 1, 2011

(54) METHOD FOR ALKALI DOPING OF THIN FILM PHOTOVOLTAIC MATERIALS

(75) Inventors: Neil M. Mackie, Fremont, CA (US); Daniel R. Juliano, Santa Clara, CA (US); Robert B. Zubeck, Los Altos, CA (US)

(73) Assignee: MiaSole, Santa Clara, CA (US)

( * ) Notice: Subject to any disclaimer, the term of this patent is extended or adjusted under 35 U.S.C. 154(b) by 25 days.

(21) Appl. No.: 12/385,570

(22) Filed: Apr. 13, 2009

(65) Prior Publication Data
US 2010/0133093 A1 Jun. 3, 2010

(51) Int. Cl.
*C23C 14/34* (2006.01)

(52) U.S. Cl. .......................... 204/192.26; 204/192.15; 136/243; 136/252; 136/262; 136/263; 136/264; 136/265

(58) Field of Classification Search ............ 204/192.15, 204/192.26; 136/243, 252, 262, 263, 264, 136/265
See application file for complete search history.

(56) References Cited

U.S. PATENT DOCUMENTS

| | | | |
|---|---|---|---|
| 4,356,073 A | 10/1982 | McKelvey | |
| 4,915,745 A * | 4/1990 | Pollock et al. | 136/265 |
| 5,435,965 A | 7/1995 | Mashima et al. | |
| 5,522,535 A | 6/1996 | Ivanov et al. | |
| 5,626,688 A * | 5/1997 | Probst et al. | 136/265 |
| 5,728,231 A * | 3/1998 | Negami et al. | 148/33 |
| 5,814,195 A | 9/1998 | Lehan et al. | |
| 5,904,966 A | 5/1999 | Lippens | |
| 6,020,556 A | 2/2000 | Inaba et al. | |
| 6,310,281 B1 | 10/2001 | Wendt et al. | |
| 6,372,538 B1 | 4/2002 | Wendt et al. | |
| 6,500,733 B1 | 12/2002 | Stanbery | |
| 6,525,264 B2 | 2/2003 | Ouchida et al. | |
| 6,559,372 B2 | 5/2003 | Stanbery | |

(Continued)

FOREIGN PATENT DOCUMENTS

JP 2006-165386 A 6/2006

(Continued)

OTHER PUBLICATIONS

U.S. Appl. No. 12/314,519, filed Dec. 11, 2008, Hollars et al.

(Continued)

*Primary Examiner*—Rodney G McDonald
(74) *Attorney, Agent, or Firm*—The Marbury Law Group, PLLC

(57) ABSTRACT

A method of manufacturing a solar cell includes providing a substrate, depositing a first electrode comprising an alkali-containing transition metal layer over the substrate, depositing at least one p-type semiconductor absorber layer over the first electrode, wherein the p-type semiconductor absorber layer includes a copper indium selenide (CIS) based alloy material, depositing an n-type semiconductor layer over the p-type semiconductor absorber layer, and depositing a second electrode over the n-type semiconductor layer. The step of depositing the alkali-containing transition metal layer includes sputtering from a first target comprising the transition metal and a second target comprising the alkali metal, where a composition of the first target is different from a composition of the second target.

20 Claims, 5 Drawing Sheets

U.S. PATENT DOCUMENTS

| | | | |
|---|---|---|---|
| 6,593,213 | B2 | 7/2003 | Stanbery |
| 6,690,041 | B2 | 2/2004 | Armstrong et al. |
| 6,736,986 | B2 | 5/2004 | Stanbery |
| 6,750,394 | B2 | 6/2004 | Yamamoto et al. |
| 6,787,692 | B2 | 9/2004 | Wada et al. |
| 6,797,874 | B2 | 9/2004 | Stanbery |
| 6,822,158 | B2 | 11/2004 | Ouchida et al. |
| 6,852,920 | B2 | 2/2005 | Sager et al. |
| 6,878,612 | B2 | 4/2005 | Nagao et al. |
| 6,881,647 | B2 | 4/2005 | Stanbery |
| 6,936,761 | B2 | 8/2005 | Pichler |
| 6,987,071 | B1 | 1/2006 | Bollman et al. |
| 7,045,205 | B1 | 5/2006 | Sager |
| 7,115,304 | B2 | 10/2006 | Roscheisen et al. |
| 7,122,392 | B2 | 10/2006 | Morse |
| 7,122,398 | B1 | 10/2006 | Pichler |
| 7,141,449 | B2 | 11/2006 | Shiozaki |
| 7,148,123 | B2 | 12/2006 | Stanbery |
| 7,163,608 | B2 | 1/2007 | Stanbery |
| 7,194,197 | B1 | 3/2007 | Wendt et al. |
| 7,196,262 | B2 | 3/2007 | Gronet |
| 7,227,066 | B1 | 6/2007 | Roscheisen et al. |
| 7,235,736 | B1 | 6/2007 | Buller et al. |
| 7,247,346 | B1 | 7/2007 | Sager et al. |
| 7,253,017 | B1 | 8/2007 | Roscheisen et al. |
| 7,259,322 | B2 | 8/2007 | Gronet |
| 7,262,392 | B1 | 8/2007 | Miller |
| 7,267,724 | B2 | 9/2007 | Tanaka et al. |
| 7,271,333 | B2 | 9/2007 | Fabick et al. |
| 7,291,782 | B2 | 11/2007 | Sager et al. |
| 7,306,823 | B2 | 12/2007 | Sager et al. |
| 7,319,190 | B2 | 1/2008 | Tuttle |
| 7,374,963 | B2 | 5/2008 | Basol |
| 2005/0109392 | A1* | 5/2005 | Hollars ............... 136/265 |
| 2007/0074969 | A1 | 4/2007 | Simpson et al. |
| 2007/0283996 | A1 | 12/2007 | Hachtmann et al. |
| 2007/0283997 | A1 | 12/2007 | Hachtmann et al. |
| 2008/0000518 | A1 | 1/2008 | Basol |
| 2008/0053519 | A1 | 3/2008 | Pearce et al. |
| 2008/0142071 | A1 | 6/2008 | Dorn et al. |
| 2008/0169025 | A1* | 7/2008 | Basol et al. ............ 136/262 |
| 2008/0283389 | A1 | 11/2008 | Aoki |
| 2008/0314432 | A1 | 12/2008 | Paulson et al. |
| 2009/0014049 | A1 | 1/2009 | Gur et al. |
| 2009/0014057 | A1 | 1/2009 | Croft et al. |
| 2009/0014058 | A1 | 1/2009 | Croft et al. |

FOREIGN PATENT DOCUMENTS

| | | |
|---|---|---|
| KR | 10-0743923 B1 | 7/2007 |
| KR | 10-2009-0034078 A | 4/2009 |

OTHER PUBLICATIONS

U.S. Appl. No. 12/379,427, filed Feb. 20, 2009, Schmidt, Chris.
U.S. Appl. No. 12/379,428, filed Feb. 20, 2009, Schmidt, Chris.
U.S. Appl. No. 12/385,572, filed Apr. 13, 2009, Mackie et al.
U.S. Appl. No. 12/385,571, filed Apr. 13, 2009, Juliano et al.
Bodegård et al., "The influence of sodium on the grain structure of $CuInSo_2$ films for photovoltaic applications," 12th European Photovoltaic Solar Energy Conference, Proceedings of the International Conference, Amsterdam, The Netherlands, Apr. 11-15, 1994, Hill et al. Ed., vol. II, 1743-1746.
Contreras et al., "On the role of Na and modifications to $Cu(In,Ga)Se_2$ absorber materials using thin-MF (M=Na, K, Cs) precursor layers," $26^{th}$ IEEE PVSC, Anaheim, California, Sep. 30-Oct. 3, 1997, 359-362.
Devaney et al., "Recent improvement in $CuInSe_2/ZnCdS$ thin film solar cell efficiency," 18th IEEE Photovoltaic Spec. Conf., 1985, New York, 1733-1734.
Evbuomwan et al., "Concurrent materials and manufacturing process selection in design function deployment," Concurrent Engineering: Research and Applications, Jun. 1995, 3(2):135-144.
Granath et al., "Mechanical issues of NO back contracts for $Cu(In,Ga)Se_2$ devices," 13th European Photovoltaic Solar Energy Conference, Proceedings of the International Conference, Nice, France, Oct. 23-27, 1995, Freiesleben et al. Ed., vol. II, 1983-1986.
Hedström et al., "$ZnO/CdS/Cu(In,Ga)Se_2$ thin film solar cells with improved performance," $23^{rd}$ IEEE Photovoltaic Specialists Conference, Louisville, Kentucky, May 10-14, 1993, 364-371.
Holz et al., "The effect of substrate impurities on the electronic conductivity in CIS thin films," $12^{th}$ European Photovoltaic Solar Energy Conference, Proceedings of the International Conference, Amsterdam, The Netherlands, Apr. 11-15, 1994, Hill et al. Ed., vol. II, 1592-1595.
Mickelsen et al., "High photocurrent polycrystalline thin-film CdS/$CuInSe_2$ solar cell," Appl. Phys. Lett., Mar. 1, 1980, 36(5):371-373.
Mohamed et al., "Correlation between structure, stress and optical properties in direct current sputtered molybdenum oxide films," Thin Solid Films, 2003, 429:135-143.
Probst et al., "The impact of controlled sodium incorporated on rapid thermal processed $Cu(InGa)Se_2$-thin films and devices," First WCPEC, Hawaii, Dec. 5-9, 2004, 144-147.
Ramanath et al., "Properties of 19.2% Efficiency $ZnO/CdS/CuInGaSe_2$ Thin-film Solar Cells," Progress in Photovoltaics: Research and Applications, 2003, 11:225-230.
Rau et al., "$Cu(In,Ga)Se_2$ solar cells," Clean Electricity From Photovoltaics, Series on Photoconversion of Solar Energy, vol. 1, 2001, Archer et al. Ed., Chapter 7, 277-345.
Rudmann et al., "Effects of NaF coevaporation on structural properties of $Cu(In,Ga)Se_2$ thin films," Thin Solid Films, 2003, 431-432:37-40.
Sakurai et al,. "Properties of Cu(In,Ga)Se2:Fe Thin Films for Solar Cells," Mater. Res. Soc. Symp. Proc., 2005, 865:F14.12.1-F.14.12.5.
Scofield et al., "Sodium diffusion, selenization, and microstructural effects associated with various molybdenum back contact layers for Cis-based solar cells," Proc. of the $24^{th}$ IEEE Photovoltaic Specialists Conference, New York, 1995, 164-167.
So et al., "Properties of Reactively Sputtered $Mo_{1-x}O_x$ Films," Appl. Phys. A, 1988, 45:265-270.
Stolt et al., "$ZnO/CdS/CuInSe_2$ thin-film solar cells with improved performance," Appl. Phys. Lett., Feb. 8, 1993, 62(6):597-599.
Windischmann, Henry, "Intrinsic Stress in Sputter-Deposited Thin Films," Critical Reviews in Solid State and Materials Science, 1992, 17(6):547-596.
Yun et al., "Fabrication of CIGS solar cells with a Na-doped Mo layer on a Na-free substrate," Thin Solid Films, 2007, 515:5876-5879.
International Serarch Report and Written Opinion, International Application PCT/US2010/030454. International Searching Authority: Korean Intellectual Property Office (ISA/KR), Nov. 12, 2010.

* cited by examiner

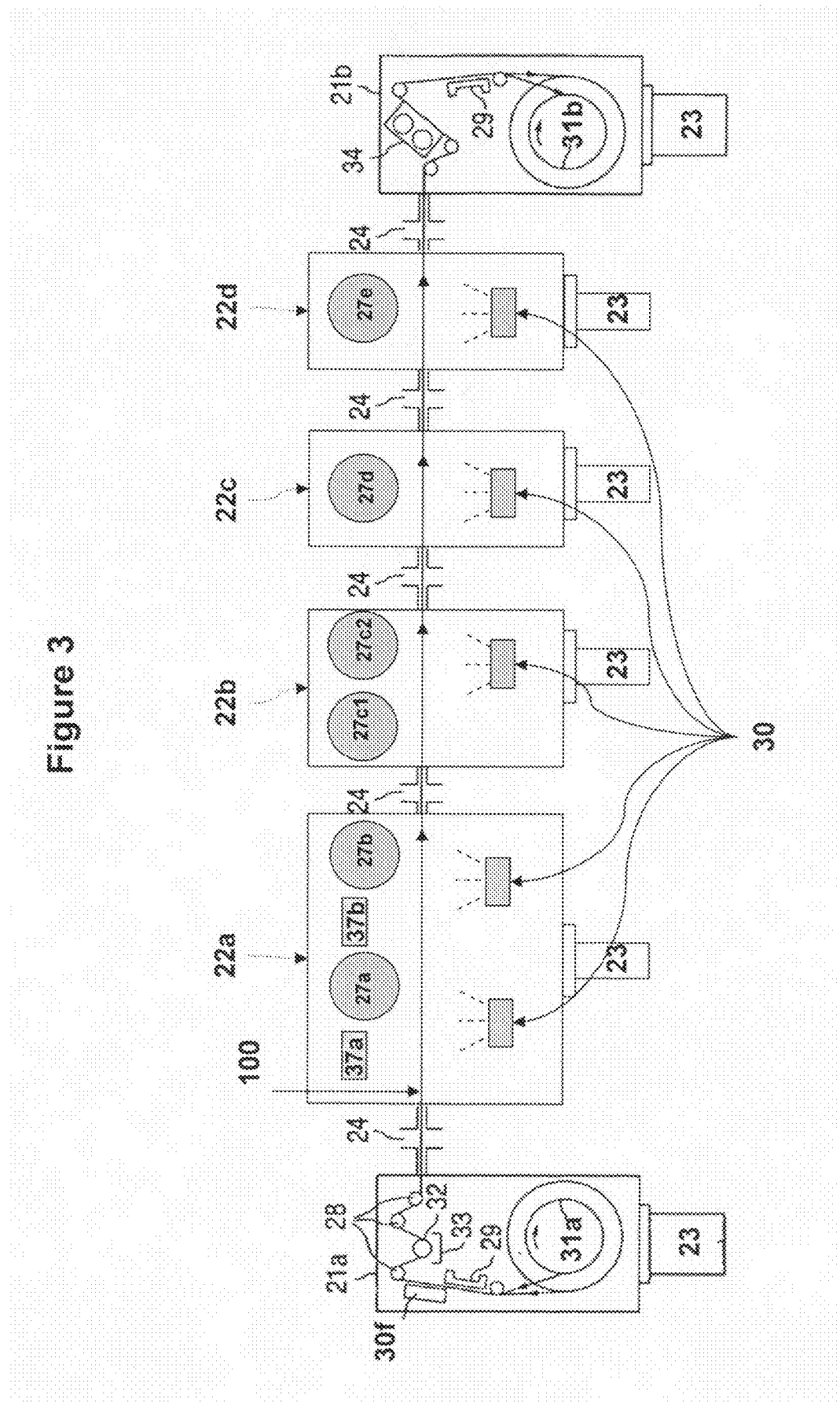

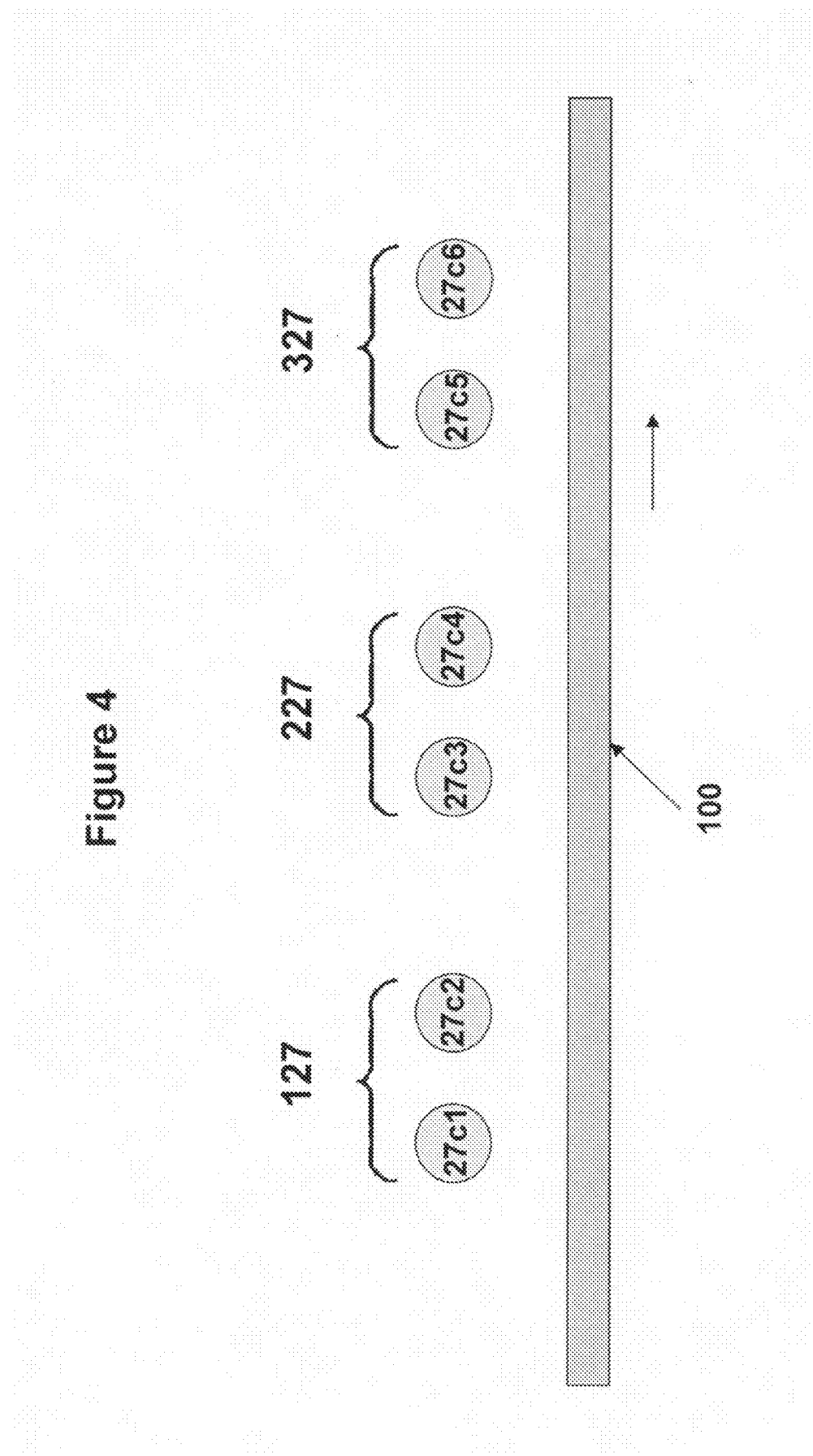

METHOD FOR ALKALI DOPING OF THIN FILM PHOTOVOLTAIC MATERIALS

FIELD OF THE INVENTION

The present invention relates generally to the field of photovoltaic devices, and more specifically to forming thin-film solar cells by sputter depositing an alkali-containing transition metal electrode.

BACKGROUND OF THE INVENTION

Copper indium diselenide ($CuInSe_2$, or CIS) and its higher band gap variants copper indium gallium diselenide ($Cu(In,Ga)Se_2$, or CIGS), copper indium aluminum diselenide ($Cu(In,Al)Se_2$), copper indium gallium aluminum diselenide ($Cu(In,Ga,Al)Se_2$) and any of these compounds with sulfur replacing some of the selenium represent a group of materials, referred to as copper indium selenide CIS based alloys, have desirable properties for use as the absorber layer in thin-film solar cells. To function as a solar absorber layer, these materials should be p-type semiconductors. This may be accomplished by establishing a slight deficiency in copper, while maintaining a chalcopyrite crystalline structure. In CIGS, gallium usually replaces 20% to 30% of the normal indium content to raise the band gap; however, there are significant and useful variations outside of this range. If gallium is replaced by aluminum, smaller amounts of aluminum are used to achieve the same band gap.

SUMMARY OF THE INVENTION

One embodiment of this invention provides a method of manufacturing a solar cell including depositing a first electrode comprising an alkali-containing transition metal layer over a substrate, depositing at least one p-type semiconductor absorber layer over the first electrode, wherein the p-type semiconductor absorber layer includes a copper indium selenide (CIS) based alloy material, depositing an n-type semiconductor layer over the p-type semiconductor absorber layer, and depositing a second electrode over the n-type semiconductor layer. The step of depositing the alkali-containing transition metal layer comprises sputtering from a first target comprising the transition metal and a second target comprising the alkali metal, and a composition of the first target is different from a composition of the second target.

Another embodiment of the invention provides a method of manufacturing a solar cell including depositing a first electrode comprising a sodium-containing molybdenum layer over a substrate, depositing at least one p-type semiconductor absorber layer over the first electrode, wherein the p-type semiconductor absorber layer includes a copper indium selenide (CIS) based alloy material, depositing an n-type semiconductor layer over the p-type semiconductor absorber layer, depositing a second electrode over the n-type semiconductor layer, and diffusing sodium from sodium-containing molybdenum layer into the at least one p-type semiconductor absorber layer. The step of depositing the sodium-containing molybdenum layer comprises DC sputtering from a first molybdenum target and RF sputtering from a second sodium fluoride target.

A method of manufacturing a solar cell, comprising depositing a transparent electrode over a substrate, depositing an n-type semiconductor layer over the transparent electrode, depositing at least one p-type semiconductor absorber layer over the n-type semiconductor layer, where the p-type semiconductor absorber layer includes a copper indium selenide (CIS) based alloy material, and depositing a top electrode comprising an alkali-containing transition metal layer over the at least one p-type semiconductor absorber layer. The step of depositing the alkali-containing transition metal layer comprises sputtering from a first target comprising the transition metal and a second target comprising the alkali metal, and a composition of the first target is different from a composition of the second target.

BRIEF DESCRIPTION OF THE DRAWINGS

FIG. 3 shows a highly simplified schematic diagram of a top view of a modular sputtering apparatus that can be used to manufacture the solar cell depicted in FIG. 2.

FIG. 4 illustrates schematically the use of three sets of dual magnetrons to increase the deposition rate and grade the composition of the CIS layer to vary its band gap.

DESCRIPTION OF THE PREFERRED EMBODIMENTS

Figure 1:
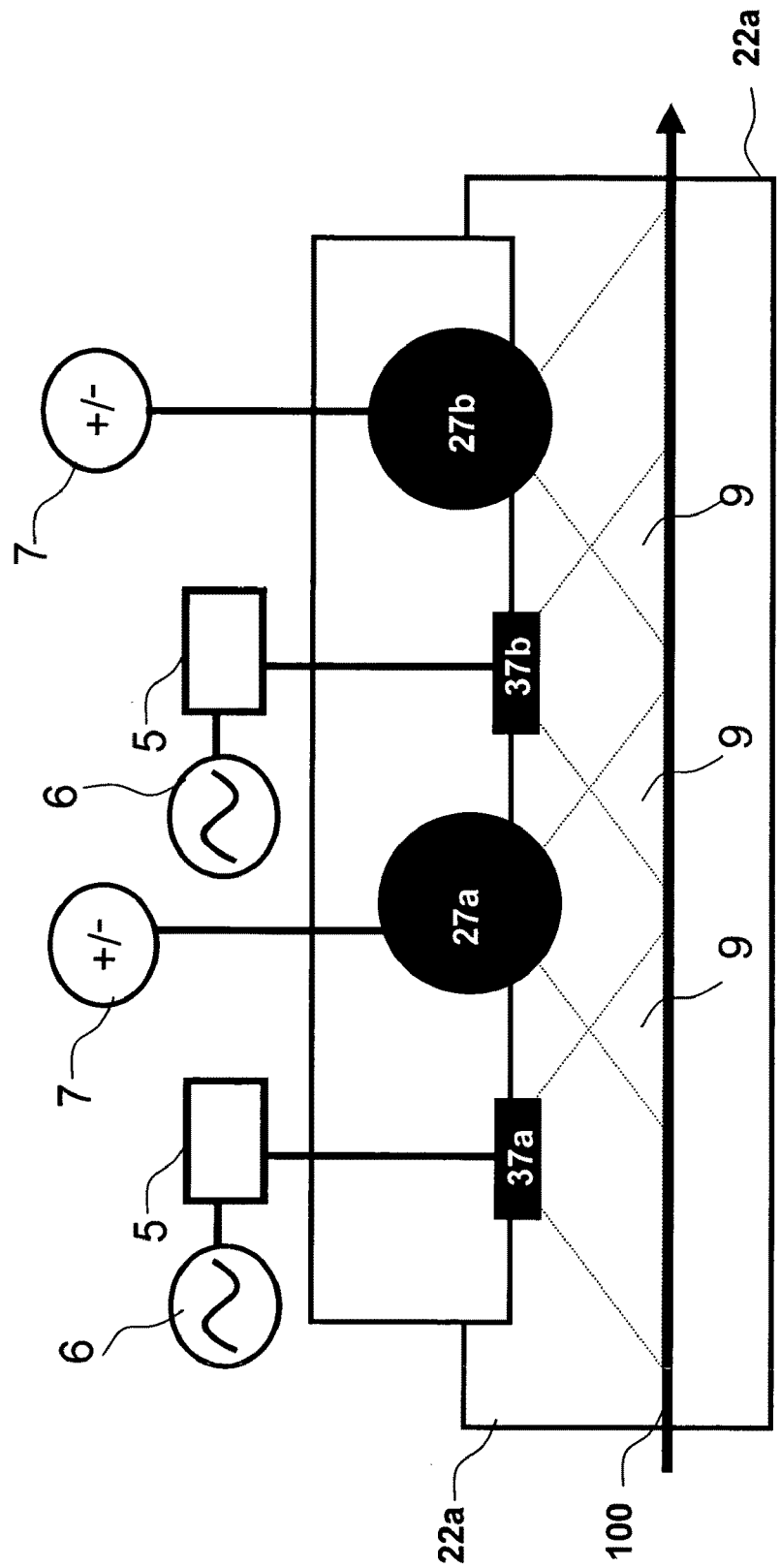
FIG. 1 shows a highly simplified schematic diagram of a top view of a sputtering apparatus that can be used to forming an alkali-containing transition metal layer, for example, a sodium-containing molybdenum film.

As grown CIS films are intrinsically p-type doped. However, it was found that a small amount of sodium dopants in CIS films increases the p-type conductivity of the CIGS film and the open circuit voltage, and in turn, improves the efficiency of the solar cell. For example, Ramanathan (Ramanathan et al., Prog. Photovolt. Res. Appl. 11 (2003) 225, incorporated herein by reference in its entirety) teaches that a solar cell, having an efficiency as high as 19.5%, may be obtained by using a soda-lime glass substrate in combination with depositing a CIS film under a high growth temperature. This method significantly improves the efficiency of a traditional solar cell by diffusing sodium from the glass substrate into the CIS film. However, it is difficult to control the amount of the sodium provided to the CIS film and the speed of the sodium diffusion from a glass substrate. Furthermore, unlike glass substrates, other substrates, such as metal and plastic substrates, do not provide such a readily available supply of sodium.

Rudmann (Rudmann et al., Thin Solid Films 32 (2003) 37) teaches forming a NaF or NaSe layer between the CIGS layer and a first electrode (also referred as a back electrode). Sodium doping in this system can be controlled by modulating the sodium diffusion from the NaF or NaSe layer into the CIGS layer. Although the amount of sodium in CIGS may be more controllable than in the Ramanathan method, the NaF or NaSe interlayer results in a poor adhesion and a greater schottky barrier between the CIGS layer and the first electrode.

Yun (Yun et al, Thin Solid Films 515(2007) 5876-5879) teaches DC sputtering sodium-containing molybdenum layer from a composite Na—Mo target. It has been found that resulting solar cells have an improved efficiency because the sodium incorporation enhances the open circuit voltage and fill factor. However, this method is limited by the property of the Na—Mo target, which has a high propensity to crack. Yun's method also requires a technically complicated composite target that contains a sufficiently high sodium content so as to be retained in the resulting film. Furthermore, it is difficult and expensive to adjust the sodium concentration in the deposited molybdenum layer because it is substantially determined by the composition of the target.

One embodiment of the present invention provides a method of manufacturing a solar cell including depositing a first electrode comprising an alkali-containing transition metal layer over a substrate, depositing at least one p-type semiconductor absorber layer over the first electrode, wherein the p-type semiconductor absorber layer includes a copper indium selenide (CIS) based alloy material, depositing an n-type semiconductor layer over the p-type semiconductor absorber layer, and depositing a second electrode over the n-type semiconductor layer. The step of depositing the alkali-containing transition metal layer comprises sputtering from a first target comprising the transition metal and a second target comprising the alkali.

The sputtering rate of the transition metal from the first target and the sputtering rate of alkali from the second target can be independently controlled. Consequently, the thickness of deposited transition metal sublayers and the thickness of alkali-containing sublayers in the alkali-containing molybdenum layer may be independently controlled to control an amount of alkali diffused into the at least one p-type semiconductor absorber layer, and/or to generate a variable alkali content as a function of thickness in the alkali-containing transition metal layer. The transition metal sublayers and the alkali-containing sublayers may become intermixed, forming a continuous alkali-containing transition metal layer, one or more steps of sputtering the alkali-containing transition metal layer, depositing the at least one p-type semiconductor absorber layer, or an optional post deposition annealing process.

One advantage of this embodiment is that the alkali-containing transition metal layer provides an alkali source that may be controllably diffused to the CIS based layer. Another advantage is that the amount of alkali in the first electrode and, in turn, in the CIS based layer can be easily tuned by adjusting the sputtering rates from the first target and the second target. Furthermore, a metal selenide (not shown) may be formed at the interface of the first electrode and CIS based layer during the CIS based layer deposition or during one or more optional annealing steps after the CIS based layer deposition. This metal selenide interfacial layer improves the adhesion and provides a good ohmic contact between the alkali-containing transition metal layer and the CIS based layer.

In some embodiments, the step of depositing the alkali-containing transition metal layer comprises DC sputtering the transition metal from the first target and pulsed DC sputtering, AC sputtering, or RF sputtering the alkali compound from the second target. Any suitable variations of the sputtering methods may be used. For example, for electrically insulating second target materials, AC sputtering refers to any variation of AC sputtering methods that may be used to for insulating target sputtering, such as medium frequency AC sputtering or AC pairs sputtering. The composition of the first target is different from a composition of the second target. For example, the first target may be electrically conductive while the second target may be electrically insulating. In one embodiment, the first target may be substantially free of alkali. As used herein, the term "substantially free of alkali" means that no alkali metal or other alkali-containing material is intentionally alloyed or doped, but unavoidable impurities of alkali may present.

The alkali-containing transition metal layer sputtering process may further comprise DC sputtering from a third electrically conductive target comprising the transition metal, and pulsed DC sputtering, AC sputtering, or RF sputtering from a fourth electrically insulating target comprising the alkali. A composition of the first target may be the same as a composition of the third target, and a composition of the second target may be the same as a composition of the fourth target. The second target is located between the first and the third targets in the same vacuum chamber of the magnetron sputtering system, and the third target is located between the second and the fourth targets in the same vacuum chamber of the magnetron sputtering system. If desired, more than four targets may be used to sputter the alkali-containing transition metal layer.

For example, by using a sputtering apparatus illustrated in FIG. 1, an alkali-containing transition metal layer (not shown in FIG. 1, and referred to as layer 202 in FIGS. 2-3) may be deposited over a substrate 100. Targets comprising an alkali-containing material (e.g., targets 37a and 37b) and targets comprising a transition metal (e.g., 27a and 27b) are located in a sputtering process module 22a, such as a vacuum chamber. In this non-limiting example, the transition metal targets 27a and 27b are rotating Mo cylinders and are powered by DC power sources 7, and the alkali-containing targets 37a and 37b are planar NaF targets and are powered by RF generators 6 through matching networks 5. The target types alternate and end with a transition metal target, for example target 27b as shown in FIG. 1. The distance between the adjacent targets is small enough such that a sufficient overlap 9 may exist between the alternating transition and metal alkali containing fluxes and thus enhance the intermixing of the transition metal and the alkali-containing material during depositing the alkali-containing transition metal layer.

The substrate 100 may be a foil web, for example, a metal web substrate, a polymer web substrate, or a polymer coated metal web substrate, and may be continuously passing through the sputtering module 22a during the sputtering process, following the direction of the imaginary arrow along the web 100. Any suitable materials may be used for the foil web. For example, metal (e.g., stainless steel, aluminum, or titanium) or thermally stable polymers (e.g., polyimide or the like) may be used. The foil web 100 may move at a constant or variable rate to enhance intermixing.

The transition metal of the alkali-containing transition metal layer may be one of Mo, W, Ta, V, Ti, Nb, Zr, or alloys thereof. The alkali metal of the alkali-containing transition metal layer may be one of Li, Na, K, or combinations thereof. In one embodiment, the step of depositing the alkali-containing transition metal layer may comprise DC sputtering a first target comprising a transition metal, such as molybdenum, and pulsed DC sputtering, AC sputtering, or RF sputtering a second target comprising alkali-containing material, such as a sodium-containing material. The sodium-containing material may comprise any material containing sodium, for example alloys or compounds of sodium with one or more of selenium, sulfur, oxygen, nitrogen or barrier metal (such as molybdenum, tungsten, tantalum, vanadium, titanium, niobium or zirconium), such as sodium fluoride, sodium molybdate, sodium fluoride, sodium selenide, sodium hydroxide, sodium oxide, sodium sulfate, sodium tungstate, sodium selenate, sodium selenite, sodium sulfide, sodium sulfite, sodium titanate, sodium metavanadate, sodium orthovanadate, or combinations thereof. Alloys or compounds of lithium and/or potassium may be also used, for example but not limited to alloys or compounds of lithium or potassium with one or more of selenium, sulfur, oxygen, nitrogen, molybdenum, tungsten, tantalum, vanadium, titanium, niobium or zirconium. The transition metal target may comprise a pure metal target, a metal alloy target, a metal oxide target (such as a molybdenum oxide target), etc.

In one embodiment, the transition metal is molybdenum, and the alkali-containing transition metal layer comprises molybdenum intentionally doped with at least one alkali element, such as sodium. In this embodiment, if the alkali-containing target is NaF, then the alkali-containing transition metal layer is a sodium-containing molybdenum layer comprising at least 95 atomic percent of molybdenum, between 0.01 atomic percent and 1.5 atomic percent of sodium, and greater than zero and less than 1 atomic percent fluorine. The fluorine can be omitted or replaced with another element if a target comprising a material other than NaF is used. Likewise, sodium may be replaced in whole or in part by lithium or potassium. The sodium-containing molybdenum layer may contain elements other than molybdenum and sodium, such as fluorine or other materials that are diffused into this layer during deposition, such as indium, copper, selenium and/or barrier layer metals. Preferably, the CIS based layer contains 0.005 to 1.5 atomic percent, such as 0.005 to 0.0.4 atomic percent sodium, for example $1 \times 10^{19}$ cm$^{-3}$ to $1 \times 10^{22}$ cm$^{-3}$ sodium, such as $1 \times 10^{19}$ cm$^{-3}$ to $1 \times 10^{20}$ cm$^{-3}$ sodium after the sodium diffuses in from the alkali-containing transition metal. Preferably, the alkali-containing transition metal layer contains more sodium than the CIS based layer, such as 0.01 to 1.5 atomic percent sodium, such as 0.01 to 0.04 atomic percent sodium, for example $1 \times 10^{20}$ cm$^{-3}$ to $1 \times 10^{23}$ cm$^{-3}$ sodium. The amount of sodium diffused into the at least one p-type semiconductor absorber layer may be tuned by independently controlling the thickness of deposited molybdenum sublayers and the thickness of sodium-containing sublayers in the sodium-containing molybdenum layer, by independently tuning the sputtering rate of the first target comprising molybdenum and the sputtering rate of the second target comprising sodium. A variable sodium content as a function of thickness in the sodium-containing molybdenum layer may also be generated by independently controlling the thickness of the deposited molybdenum sublayers and the thickness of the sodium-containing sublayers in the sodium-containing molybdenum layer. The molybdenum sublayers and the sodium-containing sublayers may become intermixed, forming a continuous sodium-containing molybdenum layer, during at least one of the steps of depositing the sodium-containing molybdenum layer, depositing the at least one p-type semiconductor absorber layer, or an optional post-deposition annealing process.

Figure 2:
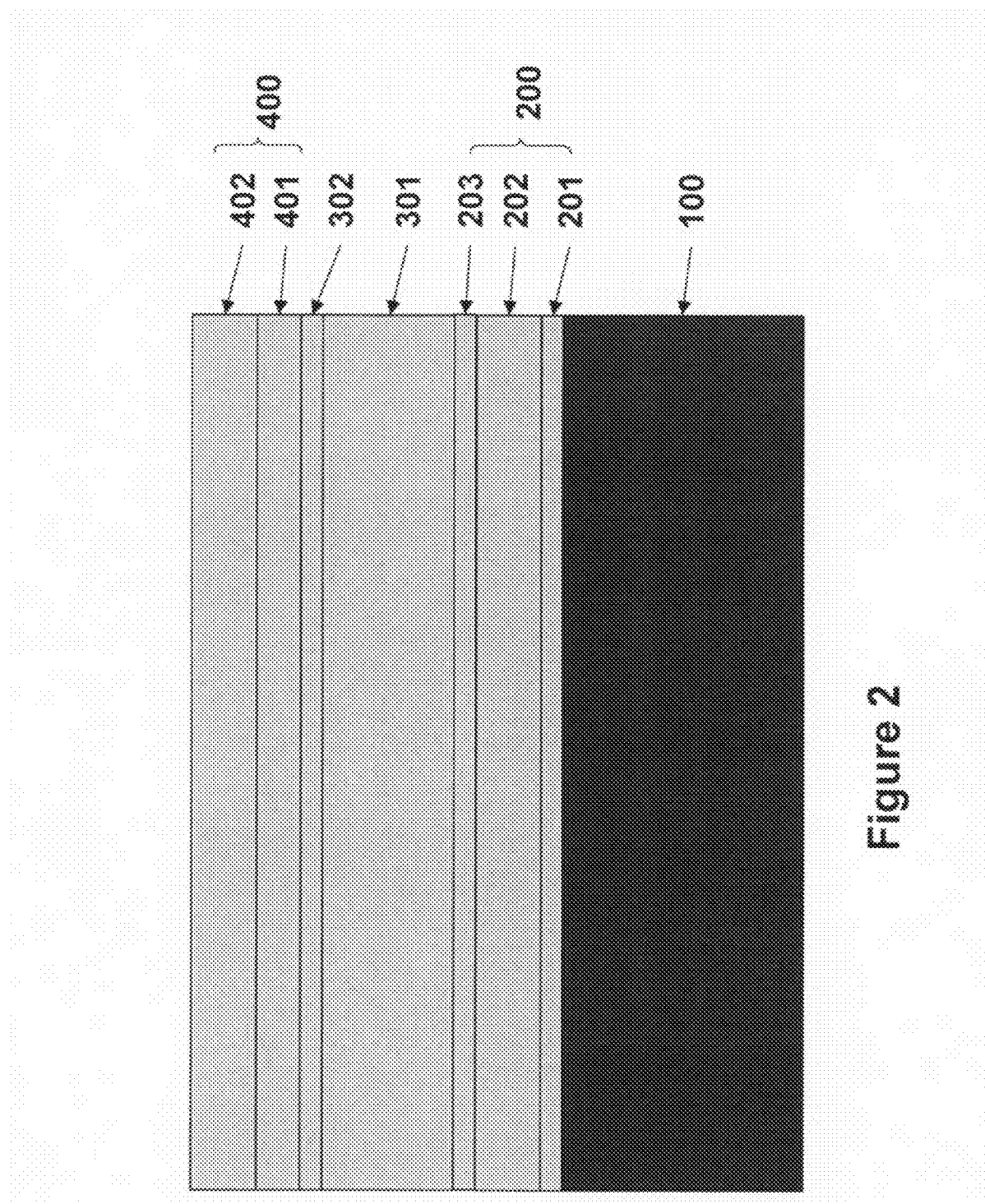
FIG. 2 is a schematic side cross-sectional view of a CIS based solar cell according to one embodiment of the invention.

One embodiment provides a solar cell having a structure illustrated in FIG. 2. The solar cell contains the substrate 100 and a first (lower) electrode 200. Optionally, the first electrode 200 of the solar cell may comprise one or more barrier layers 201 located under the alkali-containing transition metal layer 202, and/or one or more adhesion layers 203 located over the alkali-containing transition metal layer 202. In some embodiments, the barrier layer 201 is denser than the adhesion layer 203, and substantially prevents alkali diffusion from the alkali-containing transition metal layer 202 into the substrate 100. In these embodiments, alkali may diffuse from the alkali-containing transition metal layer 202, through the lower density adhesion layer 203, into the at least one p-type semiconductor absorber layer 301 during and/or after the step of depositing the at least one p-type semiconductor absorber layer 301. The optional barrier layer 201 and adhesion layer 203 may comprise any suitable materials. For example, they may be independently selected from a group consisting Mo, W, Ta, V, Ti, Nb, Zr, Cr, TiN, ZrN, TaN, VN, $V_2N$ or combinations thereof. In one embodiment, while the barrier layer 201 may be oxygen free, the alkali-containing transition metal layer 202 and/or the adhesion layer 203 may contain oxygen and/or be deposited at a higher pressure than the barrier layer 201 to achieve a lower density than the barrier layer 201. For example, layer 202 may optionally contain 5 to 40 atomic percent oxygen and layer 203 may optionally contain 1 to 10 atomic percent oxygen.

Alternatively, the optional one or more barrier layers 201 and/or optional one or more adhesion layers 203 may be omitted. When the optional one or more adhesion layers 203 are omitted, the at least one p-type semiconductor absorber layer 301 is deposited over the alkali-containing transition metal layer 202, and alkali may diffuse from the alkali-containing transition metal layer 202 into the at least one p-type semiconductor absorber layer 301 during or after the deposition of the at least one p-type semiconductor absorber layer 301.

In preferred embodiments, the p-type semiconductor absorber layer 301 may comprise a CIS based alloy material selected from copper indium selenide, copper indium gallium selenide, copper indium aluminum selenide, or combinations thereof. Layer 301 may have a stoichiometric composition having a Group I to Group III to Group VI atomic ratio of about 1:1:2, or a non-stoichiometric composition having an atomic ratio of other than about 1:1:2. Preferably, layer 301 is slightly copper deficient and has a slightly less than one copper atom for each one of Group III atom and each two of Group VI atoms. The step of depositing the at least one p-type semiconductor absorber layer may comprise reactively AC sputtering the semiconductor absorber layer from at least two electrically conductive targets in a sputtering atmosphere that comprises argon gas and a selenium containing gas (e.g. selenium vapor or hydrogen selenide). For example, each of the at least two electrically conductive targets comprises copper, indium and gallium; and the CIS based alloy material comprises copper indium gallium diselenide.

An n-type semiconductor layer 302 may then be deposited over the p-type semiconductor absorber layer 301. The n-type semiconductor layer 302 may comprise any suitable n-type semiconductor materials, for example, but not limited to ZnS, ZnSe or CdS.

A second electrode 400, also referred to as a transparent top electrode, is further deposited over the n-type semiconductor layer 302. The transparent top electrode 400 may comprise multiple transparent conductive layers, for example, but not limited to, one or more of an Indium Tin Oxide (ITO), Zinc Oxide (ZnO) or Aluminum Zinc Oxide (AZO) layers 402 located over an optional resistive Aluminum Zinc Oxide (RAZO) layer 401. Of course, the transparent top electrode 400 may comprise any other suitable materials, for example, doped ZnO or SnO.

Optionally, one or more antireflection (AR) films (not shown) may be deposited over the transparent top electrode 400, to optimize the light absorption in the cell, and/or current collection grid lines may be deposited over the top conducting oxide.

Alternatively, the solar cell may be formed in reverse order. In this configuration, a transparent electrode is deposited over a substrate, followed by depositing an n-type semiconductor layer over the transparent electrode, depositing at least one p-type semiconductor absorber layer over the n-type semiconductor layer, and depositing a top electrode comprising an alkali-containing transition metal layer over the at least one p-type semiconductor absorber layer. The substrate may be a transparent substrate (e.g., glass) or opaque (e.g., metal). If the substrate used is opaque, then the initial substrate may be delaminated after the steps of depositing the stack of the above described layers, and then bonding a glass or other transparent substrate to the transparent electrode of the stack.

More preferably, the steps of depositing the first electrode 200, depositing the at least one p-type semiconductor absorber layer 301, depositing the n-type semiconductor layer 302, and depositing the second electrode 400 comprise sputtering the alkali-containing transition metal layer 202, the p-type absorber layer 301, the n-type semiconductor layer 302 and one or more conductive films of the second electrode 400 over the substrate 100 (preferably a web substrate in this embodiment) in corresponding process modules of a plurality of independently isolated, connected process modules without breaking vacuum, while passing the web substrate 100 from an input module to an output module through the plurality of independently isolated, connected process modules such that the web substrate continuously extends from the input module to the output module while passing through the plurality of the independently isolated, connected process modules. Each of the process modules may include one or more sputtering targets for sputtering material over the web substrate 100.

For example, a modular sputtering apparatus for making the solar cell, as illustrated in FIG. 3 (top view), may be used for depositing the layers. The apparatus is equipped with an input, or load, module 21a and a symmetrical output, or unload, module 21b. Between the input and output modules are process modules 22a, 22b, 22c and 22d. The number of process modules 22 may be varied to match the requirements of the device that is being produced. Each module has a pumping device 23, such as vacuum pump, for example a high throughput turbomolecular pump, to provide the required vacuum and to handle the flow of process gases during the sputtering operation. Each module may have a number of pumps placed at other locations selected to provide optimum pumping of process gases. The modules are connected together at slit valves 24, which contain very narrow low conductance isolation slots to prevent process gases from mixing between modules. These slots may be separately pumped if required to increase the isolation even further. Other module connectors 24 may also be used. Alternatively, a single large chamber may be internally segregated to effectively provide the module regions, if desired. U.S. Published Application No. 2005/0109392 A1 ("Hollars"), filed on Oct. 25, 2004, discloses a vacuum sputtering apparatus having connected modules, and is incorporated herein by reference in its entirety.

The web substrate 100 is moved throughout the machine by rollers 28, or other devices. Additional guide rollers may be used. Rollers shown in FIG. 3 are schematic and non-limiting examples. Some rollers may be bowed to spread the web, some may move to provide web steering, some may provide web tension feedback to servo controllers, and others may be mere idlers to run the web in desired positions. The input spool 31a and optional output spool 31b thus are actively driven and controlled by feedback signals to keep the web in constant tension throughout the machine. In addition, the input and output modules may each contain a web splicing region or device 29 where the web 100 can be cut and spliced to a leader or trailer section to facilitate loading and unloading of the roll. In some embodiments, the web 100, instead of being rolled up onto output spool 31b, may be sliced into solar modules by the web splicing device 29 in the output module 21b. In these embodiments, the output spool 31b may be omitted. As a non-limiting example, some of the devices/steps may be omitted or replaced by any other suitable devices/steps. For example, bowed rollers and/or steering rollers may be omitted in some embodiments.

Heater arrays 30 are placed in locations where necessary to provide web heating depending upon process requirements. These heaters 30 may be a matrix of high temperature quartz lamps laid out across the width of the web. Infrared sensors provide a feedback signal to servo the lamp power and provide uniform heating across the web. In one embodiment, as shown in FIG. 3, the heaters are placed on one side of the web 100, and sputtering targets 27a-e and 37a-b are placed on the other side of the web 100. Sputtering targets 27 and 37 may be mounted on dual cylindrical rotary magnetron(s), or planar magnetron(s) sputtering sources, or RF sputtering sources.

After being pre-cleaned, the web substrate 100 may first pass by heater array 30f in module 21a, which provides at least enough heat to remove surface adsorbed water. Subsequently, the web can pass over roller 32, which can be a special roller configured as a cylindrical rotary magnetron. This allows the surface of electrically conducting (metallic) webs to be continuously cleaned by DC, AC, or RF sputtering as it passes around the roller/magnetron. The sputtered web material is caught on shield 33, which is periodically changed. Preferably, another roller/magnetron may be added (not shown) to clean the back surface of the web 100. Direct sputter cleaning of a web 100 will cause the same electrical bias to be present on the web throughout the machine, which, depending on the particular process involved, might be undesirable in other sections of the machine. The biasing can be avoided by sputter cleaning with linear ion guns instead of magnetrons, or the cleaning could be accomplished in a separate smaller machine prior to loading into this large roll coater. Also, a corona glow discharge treatment could be performed at this position without introducing an electrical bias.

Next, the web 100 passes into the process module 22a through valve 24. Following the direction of the imaginary arrows along the web 100, the full stack of layers may be deposited in one continuous process. The first electrode 202 may be sputtered in the process module 22a over the web 100, as illustrated in FIG. 3 (and previously in FIG. 1). Optionally, the process module 22a may include more than two pairs of targets, each pair of targets comprising a transition metal target 27 and an alkali-containing target 37, arranged in such a way that the types of targets alternate and the series of targets end with a transition metal target. The alkali-containing target has a composition different from that of the transition metal target.

The web 100 then passes into the next process module, 22b, for deposition of the at least one p-type semiconductor absorber layer 301. In a preferred embodiment shown in FIG. 3, the step of depositing the at least one p-type semiconductor absorber layer 301 includes reactively alternating current (AC) magnetron sputtering the semiconductor absorber layer from at least one pair of two conductive targets 27c1 and 27c2, in a sputtering atmosphere that comprises argon gas and a selenium-containing gas. In some embodiment, the pair of two conductive targets 27c1 and 27c2 comprise the same targets. For example, each of the at least two conductive targets 27c1 and 27c2 comprises copper, indium and gallium, or comprises copper, indium and aluminum. The selenium-containing gas may be hydrogen selenide or selenium vapor. In other embodiments, targets 27c1 and 27c2 may comprise different materials from each other. The radiation heaters 30 maintain the web at the required process temperature, for example, around 400-800° C., for example around 500-700° C., which is preferable for the CIS based alloy deposition.

In some embodiments, at least one p-type semiconductor absorber layer 301 may comprise graded CIS based material. In this embodiment, the process module 22b further comprises at least two more pairs of targets (227, and 327), as illustrated in FIG. 4. The first magnetron pair 127 (27c1 and 27c2) are used to sputter a layer of copper indium diselenide while the next two pairs 227, 327 of magnetrons targets (27c3, 27c4 and 27c5, 27c6) sputter deposit layers with increasing amounts of gallium (or aluminum), thus increasing and grading the band gap. The total number of targets pairs may be varied, for example may be 2-10 pairs, such as 3-5 pairs. This will grade the band gap from about 1 eV at the bottom to about 1.3 eV near the top of the layer. Details of depositing the graded CIS material is described in the Hollars published application, which is incorporated herein by reference in its entirety.

Optionally, one or more process modules (not shown) may be added between the process modules 21a and 22a to sputter a back side protective layer over the back side of the substrate 100 before the electrode 200 is deposited on the front side of the substrate. U.S. application Ser. No. 12/379,428 titled "Protective Layer for Large-Scale Production of Thin-Film Solar Cells" and filed on Feb. 20, 2009, which is hereby incorporated by reference, describes such deposition process. Further, one or more barrier layers 201 may be sputtered over the front side of the substrate 100 in the process module(s) added between the process modules 21a and 22a. Similarly, one or more process modules (not shown) may be added between the process modules 22a and 22b, to sputter one or more adhesion layers 203 between the alkali-containing transition metal layer 202 and the CIGS layer 301.

The web 100 may then pass into the process modules 22c and 22d, for depositing the n-type semiconductor layer 302, and the transparent top electrode 400, respectively. Any suitable type of sputtering sources may be used, for example, rotating AC magnetrons, RF magnetrons, or planar magnetrons. Extra magnetron stations (not shown), or extra process modules (not shown) could be added for sputtering the optional one or more AR layers.

Finally, the web 100 passes into output module 21b, where it is either wound onto the take up spool 31b, or sliced into solar cells using cutting apparatus 29. While sputtering was described as the preferred method for depositing all layers onto the substrate, some layers may be deposited by MBE, CVD, evaporation, plating, etc., while, preferably, the CIS based alloy is reactively sputtered.

Non-Limiting Working Example

Figure 5A:
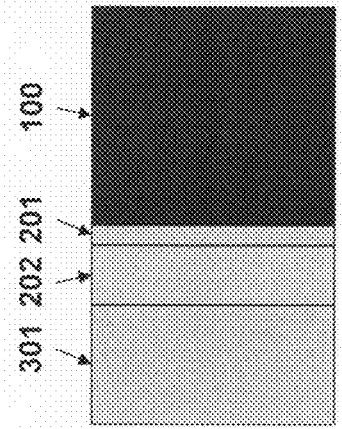
FIG. 5a shows a schematic side cross-sectional view of a non-limiting working example.

A non-limiting working example of a solar cell having a structure illustrated in FIG. 5a, is obtained by sputter depositing a sodium-containing molybdenum layer 202 over a molybdenum barrier layer 201 on a steel web substrate 100 using an apparatus illustrated in FIG. 1. A CIGS layer 301 is then deposited over the sodium-containing molybdenum layer, resulting in a structure as shown in FIG. 5a.

Figure 5B:
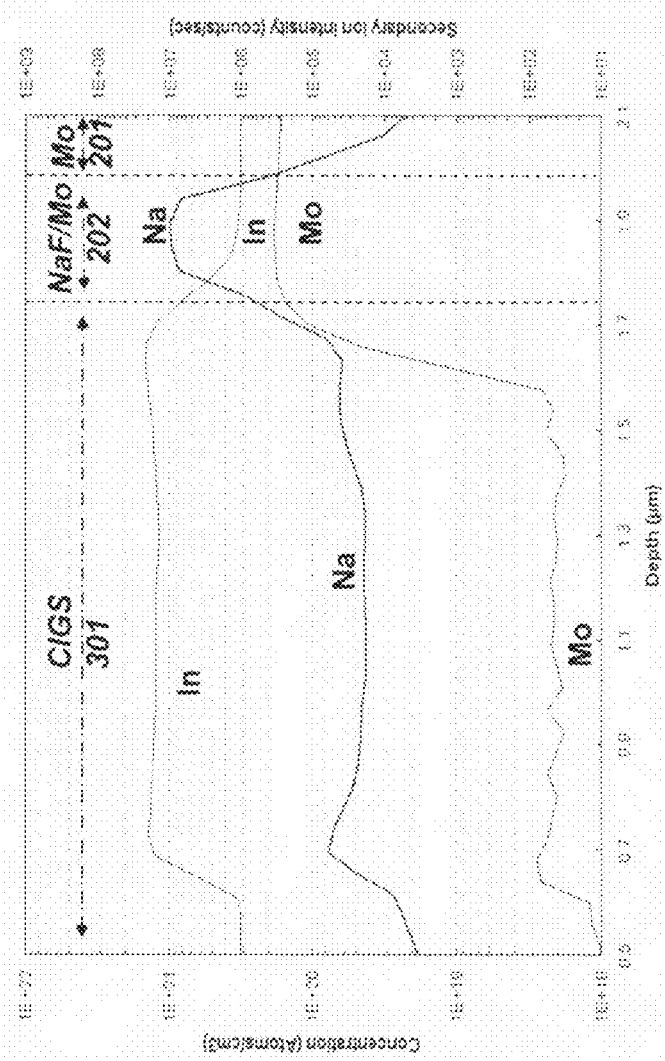
FIG. 5b shows Secondary Ion Mass Spectrometry (SIMS) spectra of In, Na, and Mo in the films of a non-limiting working example.

FIG. 5b shows SIMS depth profiles through a film stack containing the CIGS layer 301, the sodium-containing molybdenum layer 202 deposited by co-sputtering a molybdenum target and a sodium fluoride target, and the molybdenum barrier layer 201 deposited on the steel web substrate 100. Left y-axis refers to the calculated concentration of sodium, and right y-axis refers to raw ion counts of In and Mo. The interface of the CIGS layer 301 and the sodium-containing molybdenum layer 202 can be clearly determined by the In and Mo spectra. Around $10^{19}$ atoms/cm$^3$ to $10^{20}$ atoms/cm$^3$ sodium is detected in the CIGS layer 301, demonstrating that a substantial amount of sodium is diffused into the CIGS layer 301 from the sodium-containing molybdenum layer 202 during the deposition of CIGS layer 301. Around $10^{20}$ atoms/cm$^3$ to $10^{21}$ atoms/cm$^3$ sodium is detected in the sodium-containing molybdenum layer 202. The sodium content is shown on the left axis and the metal content is shown on the right axis. Furthermore, the profile of sodium concentration throughout the sodium-containing molybdenum layer 202 is substantially continuous, demonstrating that the sputtered Mo and NaF are sufficiently intermixed.

It is to be understood that the present invention is not limited to the embodiment(s) and the example(s) described above and illustrated herein, but encompasses any and all variations falling within the scope of the appended claims. For example, as is apparent from the claims and specification, not all method steps need be performed in the exact order illustrated or claimed, but rather in any order that allows the proper formation of the solar cells of the present invention.

What is claimed is:

1. A method of manufacturing a solar cell, comprising:
   depositing a first electrode comprising an alkali-containing transition metal layer over a substrate, wherein the step of depositing the alkali-containing transition metal layer comprises sputtering from a first target comprising the transition metal and a second target comprising the alkali metal, wherein a composition of the first target is different from a composition of the second target;
   depositing at least one p-type semiconductor absorber layer over the first electrode, wherein the p-type semiconductor absorber layer includes a copper indium selenide (CIS) based alloy material;
   depositing an n-type semiconductor layer over the p-type semiconductor absorber layer; and
   depositing a second electrode over the n-type semiconductor layer.

2. The method of claim 1, wherein the transition metal is selected from a group consisting of Mo, W, Ta, V, Ti, Nb, and Zr.

3. The method of claim 2, wherein the transition metal comprises Mo.

4. The method of claim 1, wherein the alkali metal is selected from a group consisting of Li, Na, and K.

5. The method of claim 4, wherein the second target comprises at least one of alloy or compound of the alkali metal with one or more of selenium, sulfur, oxygen, nitrogen, molybdenum, tungsten, tantalum, vanadium, titanium, niobium or zirconium.

6. The method of claim 4, wherein the alkali metal comprises Na.

7. The method of claim 6, wherein the second target comprises at least one of alloy or compound of sodium with one or more of selenium, sulfur, oxygen, nitrogen, molybdenum, tungsten, tantalum, vanadium, titanium, niobium or zirconium.

8. The method of claim 7, wherein the second target is selected from a group consisting of sodium molybdate, sodium fluoride, sodium selenide, sodium hydroxide, sodium oxide, sodium sulfate, and sodium tungstate, sodium selenate, sodium selenite, sodium sulfide, sodium sulfite, sodium titanate, sodium metavanadate, sodium orthovanadate or a combination thereof.

9. The method of claim 1, wherein the first target is electrically conductive and the second target is electrically insulating.

10. The method of claim 9, wherein the first target comprises Mo and the second target comprises sodium fluoride.

11. The method of claim 9, wherein the step of depositing the sodium-containing transition metal layer comprises DC sputtering from the first target and pulsed DC sputtering, AC sputtering, or RF sputtering from the second target.

12. The method of claim 9, wherein the first target and the second target are located in a same vacuum chamber of a magnetron sputtering system.

13. The method of claim 12, wherein:
the step of depositing the sodium-containing transition metal layer comprises DC sputtering from the first target comprising the transition metal, pulsed DC sputtering, AC sputtering, or RF sputtering from the second target comprising sodium, DC sputtering from a third electrically conductive target comprising the transition metal, and pulsed DC sputtering, AC sputtering, or RF sputtering from a fourth electrically insulating target comprising sodium;
a composition of the first target is the same as a composition of the third target;
a composition of the second target is the same as a composition of the fourth target;
the second target is located between the first and the third targets in the same vacuum chamber of the magnetron sputtering system; and
the third target is located between the second and the fourth targets in the same vacuum chamber of the magnetron sputtering system.

14. The method of claim 10, wherein the sodium-containing transition metal layer comprises at least 95 atomic percent of the transition metal, between 0.01 atomic percent and 1.5 atomic percent of sodium and greater than zero and less than 1 atomic percent fluorine.

15. The method of claim 14, further comprising:
depositing a transition metal barrier layer under the sodium-containing transition metal layer and depositing a transition metal adhesion layer over the sodium-containing transition metal layer, wherein the barrier layer is denser than the adhesion layer; and
diffusing sodium from the sodium-containing transition metal layer into the at least one p-type semiconductor absorber layer through the adhesion layer during and after the step of depositing the at least one p-type semiconductor absorber layer, such that the barrier layer substantially prevents sodium diffusion from the sodium-containing transition metal layer into the substrate.

16. The method of claim 1, further comprising diffusing sodium from the sodium containing transition metal layer into the at least one p-type semiconductor absorber layer.

17. The method of claim 1, wherein:
the step of depositing the at least one p-type semiconductor absorber layer comprises reactively AC sputtering the semiconductor absorber layer from at least two electrically conductive targets in a sputtering atmosphere that comprises argon gas and a selenium containing gas;
each of the at least two electrically conductive targets comprises copper, indium and gallium; and
the CIS based alloy material comprises copper indium gallium diselenide.

18. The method of claim 1, wherein:
the substrate comprises a web substrate, the web substrate being selected from a metal web substrate, a polymer web substrate, or a polymer coated metal web substrate; and
the steps of depositing the first electrode, depositing the at least one p-type semiconductor absorber layer, depositing the n-type semiconductor layer, and depositing the second electrode comprise sputtering one or more conductive layers of the first electrode, the p-type absorber layer, the n-type semiconductor layer and one or more conductive layers of the second electrode over the substrate in corresponding process modules of a plurality of independently isolated, connected process modules without breaking vacuum, while passing the web substrate from an input module to an output module through the plurality of independently isolated, connected process modules such that the web substrate continuously extends from the input module to the output module while passing through the plurality of the independently isolated, connected process modules.

19. A method of manufacturing a solar cell, comprising:
depositing a transparent electrode over a substrate;
depositing an n-type semiconductor layer over the transparent electrode;
depositing at least one p-type semiconductor absorber layer over the n-type semiconductor layer, wherein the p-type semiconductor absorber layer includes a copper indium selenide (CIS) based alloy material; and
depositing a top electrode comprising an alkali-containing transition metal layer over the at least one p-type semiconductor absorber layer;
wherein:
the step of depositing the alkali-containing transition metal layer comprises sputtering from a first target comprising the transition metal and a second target comprising the alkali metal; and
a composition of the first target is different from a composition of the second target.

20. The method of claim 19, wherein the substrate comprises a transparent substrate.

* * * * *